(12) United States Patent
Wang et al.

(10) Patent No.: US 7,473,595 B2
(45) Date of Patent: Jan. 6, 2009

(54) METHOD FOR DECREASING PN JUNCTION LEAKAGE CURRENT OF DYNAMIC RANDOM ACCESS MEMORY

(75) Inventors: Yonggang Wang, Shanghai (CN); Jianguang Chang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 103 days.

(21) Appl. No.: 11/618,592

(22) Filed: Dec. 29, 2006

(65) Prior Publication Data
US 2008/0124864 A1 May 29, 2008

(30) Foreign Application Priority Data
Nov. 28, 2006 (CN) .......................... 2006 1 0118841

(51) Int. Cl.
H01L 21/8238 (2006.01)
(52) U.S. Cl. .................. 438/231; 438/232; 438/234; 438/420; 257/E21.135; 257/E21.445
(58) Field of Classification Search ................ 438/181, 438/185, 186, 188, 189, 203, 419, 420, 519; 257/E21.177, E21.178, E21.184, E21.188, 257/E21.382, E21.445, E21.473
See application file for complete search history.

(56) References Cited

U.S. PATENT DOCUMENTS

| | | | | |
|---|---|---|---|---|
| 6,162,668 A | * | 12/2000 | Oda et al. | 438/197 |
| 6,458,641 B2 | * | 10/2002 | Tsukamoto | 438/197 |
| 2002/0125510 A1 | * | 9/2002 | Ohyanagi et al. | 257/288 |
| 2004/0135186 A1 | * | 7/2004 | Yamamoto | 257/296 |
| 2006/0060909 A1 | * | 3/2006 | Chi et al. | 257/310 |

* cited by examiner

Primary Examiner—Walter L Lindsay, Jr.
Assistant Examiner—Cheung Lee
(74) Attorney, Agent, or Firm—Squire, Sanders & Dempsey, L.L.P.

(57) ABSTRACT

A method for decreasing a PN junction leakage current of a dynamic random access memory (DRAM), including the steps of: preparing an NMOS transistor formed on a P-type silicon substrate and comprising a drain; forming an insulation oxide layer on the P-type silicon substrate; etching the insulation oxide layer until the P-type silicon substrate is exposed so as to form a bit line contact hole on the drain; implanting arsenic ions into the P-type silicon substrate via the bit line contact hole to form an arsenic bit line contact window; and implanting phosphorus ions into the P-type silicon substrate via the bit line contact hole to form a phosphorus bit line contact window below the arsenic bit line contact window. In this way, a concentration gradient of N-type ions can be reduced at the bit line contact window, and further a PN junction leakage current can be reduced, thus lowing the power consumption of the DRAM when the DRAM is used for a low power consumption product.

8 Claims, 8 Drawing Sheets

METHOD FOR DECREASING PN JUNCTION LEAKAGE CURRENT OF DYNAMIC RANDOM ACCESS MEMORY

This application claims the priority of Chinese Patent Application No. 200610118841.8, filed Nov. 28, 2006, the entire disclosure of which is incorporated herein by reference.

FIELD OF THE INVENTION

The present invention relates to a method for fabricating a Dynamic Random Access Memory (DRAM), particularly to a method for fabricating a DRAM NMOS transistor, and more particularly to a method for decreasing a PN junction leakage current of the DRAM NMOS transistor in fabricating a bit line contact window of the DRAM NMOS transistor.

BACKGROUND OF THE INVENTION

The DRAM is an important memory device and, due to its versatility and low fabrication cost, has been widely used in such fields as computer, communication, home appliance, etc. As electronic technologies advance and as higher demands are continuously being made on the storage capability and functionality of the DRAM, one necessary approach is to improve the integration level of the DRAM. However, an available to a capacitor used in the DRAM has to be reduced as the integration level of the DRAM is improved.

However, as the area of the memory device is reduced continuously, a too large leakage current has become a significant factor that affects the quality or performance of the DRAM.

An existing method for fabricating a DRAM was disclosed by Chinese Patent No. 03178608. As seen in FIG. 1A, an n⁻ buried layer 101 is formed by implanting phosphorus ions into a P-type silicon substrate 100 with a dosage of $1\times10^{13}$ ions/cm³ and an energy of 1.25 MeV. A P-type well 102 is formed by implanting boron ions into the P-type silicon substrate 100 twice. A gate oxide layer 103 is formed on the P-type silicon substrate 100, and a polysilicon layer 104 is formed on the gate oxide layer 103. A metal silicide layer 105 is formed on the polysilicon layer 104, and a silicon nitride layer 107 is formed on the metal silicide layer 105, thus forming a gate structure 106 composed of the gate oxide layer 103, the polysilicon layer 104, the metal silicide layer 105 and the silicon nitride layer 107.

As seen in FIG. 1B, boron ions are implanted into the P-type well 102 by an ion implantation method so as to regulate a threshold voltage of the P-type well 102. With the gate structure 106 as a mask, a first lightly-doped drain 108 is formed by implanting phosphorus ions into the P-type well 102 at both sides of the gate structure 106 with a dosage of $1\times10^{13}$ ions/cm³ and an energy of 15 KeV.

As seen in FIG. 1C, a photoresist layer 110 is formed on the P-type silicon substrate 100, and the gate structure 106 is covered by the photoresist layer 110. An opening 112 is formed at one side of the gate structure by exposing and developing the photoresist layer 110. With the photoresist layer 110 as a mask, boron fluoride is also implanted into the P-type well 102 corresponding to the opening 112 so as to prevent the source and drain from being broken down subsequently.

As seen in FIG. 1D, a first arsenic bit line contact window 116 is formed by implanting arsenic ions into the P-type well 102 corresponding to the opening 112, with the photoresist layer 110 as a mask.

As seen in FIG. 1E, the photoresist layer 110 is stripped to form a spacer 114 at both sides of the gate structure 106, and with the gate structure 106 as a mask, a second lightly-doped drain 118 is formed by implanting phosphorus ions into the P-type well 102 with a dosage of $2\times10^{13}$ ions/cm³ and an energy of 20 KeV. Here, an area including the first and second lightly-doped drains 108 and 118 can be defined as a source 120, and an area including the first and second lightly-doped drains 108 and 118 and the first bit line contact window 116 can be defined as a drain 122.

As seen in FIG. 1F, an insulation oxide layer 124 is formed on the P-type silicon substrate 100, and the insulation oxide layer 124 at the drain 122 is etched until the P-type silicon substrate 100 is exposed, thus forming a contact hole 126. Then a second arsenic bit line contact window 128 is formed by implanting arsenic ions into the P-type well 102 at the drain 122.

As seen in FIG. 1G, the contact hole 126 is filled with tungsten to connect the drain 122 and a bit line 130, and a capacitor (not shown) is fabricated at the drain 120, thus forming a DRAM.

As can been seen from the above DRAM fabrication in the prior art, there are three N-type ion implantations of phosphor ions at the bit line contact window and there is a large gradient of dosages and energies among them. Hence implantation depths of phosphorus ions can varied considerably, resulting in a relatively large PN junction leakage current. Thus the DRAM has a high power consumption when it is used for a low power consumption product.

SUMMARY OF THE INVENTION

In view of the above, the present invention provides a method for decreasing a PN junction leakage current of a dynamic random access memory (DRAM). This can obviate the problem that the DRAM is in a high power consumption when it is used for a low power consumption product because a large gradient of dosages and energies for N-type ions, such as phosphorus ions, at the bit line contact window, causes a large difference among the implantation depths of phosphorus ions, resulting in a relatively large PN junction leakage current.

To this end, an embodiment of the present invention provides a method for decreasing a PN junction leakage current of DRAM. The method includes the steps of: preparing an NMOS transistor formed on a P-type silicon substrate and comprising a drain; forming an insulation oxide layer on the P-type silicon substrate; etching the insulation oxide layer until the P-type silicon substrate is exposed to form a bit line contact hole on the drain; implanting arsenic ions into the P-type silicon substrate via the bit line contact hole to form an arsenic bit line contact window; and implanting phosphorus ions into the P-type silicon substrate via the bit line contact hole to form a phosphorus bit line contact window below the arsenic bit line contact window.

Optionally, trivalent phosphorus ions selected by a magnetic field may be implanted into the P-type well after ionizing phosphine. An energy for implanting phosphorus ions may be 15 to 45 KeV, and a dosage of phosphorus ions may be $1\times10^{13}$ to $9\times10^{13}$ ions/cm³.

Optionally, the insulation oxide layer with a thickness of 30 to 40 Å may be formed on the P-type substrate by an oxidation method.

Optionally, the insulation oxide layer may be etched until the P-type silicon substrate is exposed by a dry etch method to form the bit line contact hole on the drain.

Optionally, arsenic ions may be implanted into the P-type silicon substrate by an ion implantation method. An energy for implanting arsenic ions may be 7 to 15 KeV, and a dosage of arsenic ions may be $1\times10^{15}$ ions/cm$^3$.

The invention can be advantageous over prior art in that the contact window can be formed by implanting phosphorus ions into the P-type silicon substrate. As a result, a concentration gradient of N-type ions, such as phosphorus ions, can be reduced at the bit line contact window, and the difference between the implantation depths of phosphorus ions can be reduced, resulting in a reduced PN junction leakage current. Thus the DRAM has a low power consumption when it is used for a low power consumption product.

BRIEF DESCRIPTIONS OF THE DRAWINGS

DETAILED DESCRIPTIONS OF THE EMBODIMENTS

The DRAM is one of the most important memory devices and has been widely used in such fields as computer, communication, home appliance, etc., due to its versatility and low fabrication cost. However, as the memory device is reduced in size, it becomes significant to prevent a leakage current so as to store charges in the DRAM. Many kinds of leakage currents may affect the charges stored in the DRAM, including an interface leakage current, a sub-VT leakage, or a current leakage through a dielectric in a storage capacitor and a current leaking through other parasitic leakage paths. According to an embodiment of the present invention, a phosphorus bit line contact window is formed by implanting phosphorus ions into a P-type silicon substrate. Thus a concentration gradient of N-type ions, such as phosphorus ions, can be reduced at a bit line contact window, and the difference between implantation depths of phosphorus ions can be reduced, resulting in a reduced PN junction leakage current. And thus the DRAM has a lowed power consumption when it is used in a low power consumption product. In order to make the above objects, characteristics and advantages of the present invention more apparent and readily understood, an embodiment thereof will be described in detail with reference to the drawings.

Figure 1A:
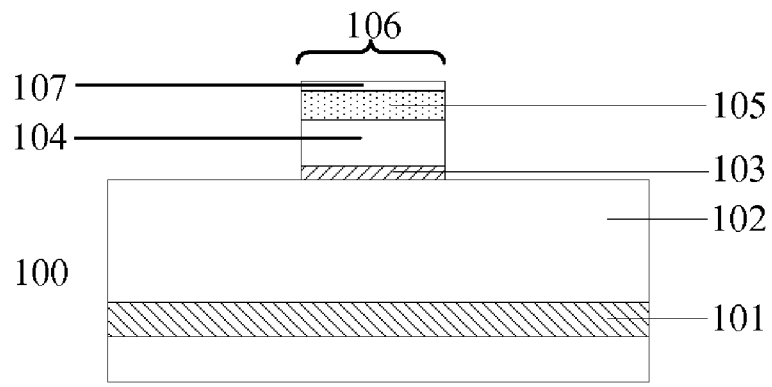
FIG. 1A through FIG. 1G are schematic diagrams of a process for fabricating a DRAM in the prior art.
Figure 1B:
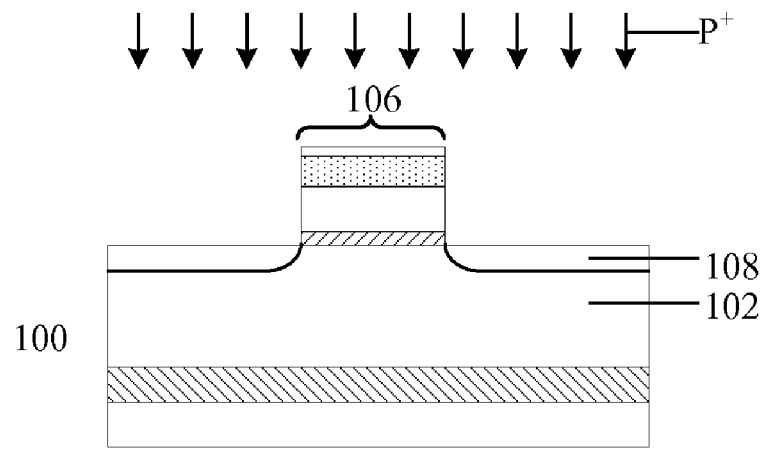
Figure 1C:
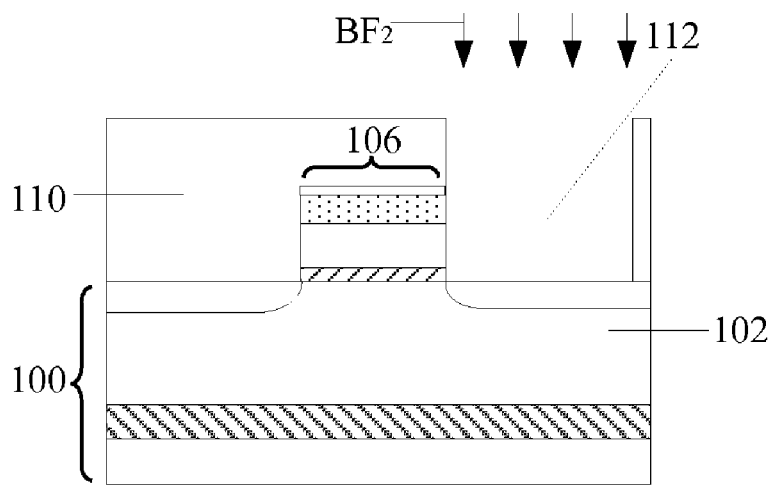
Figure 1D:
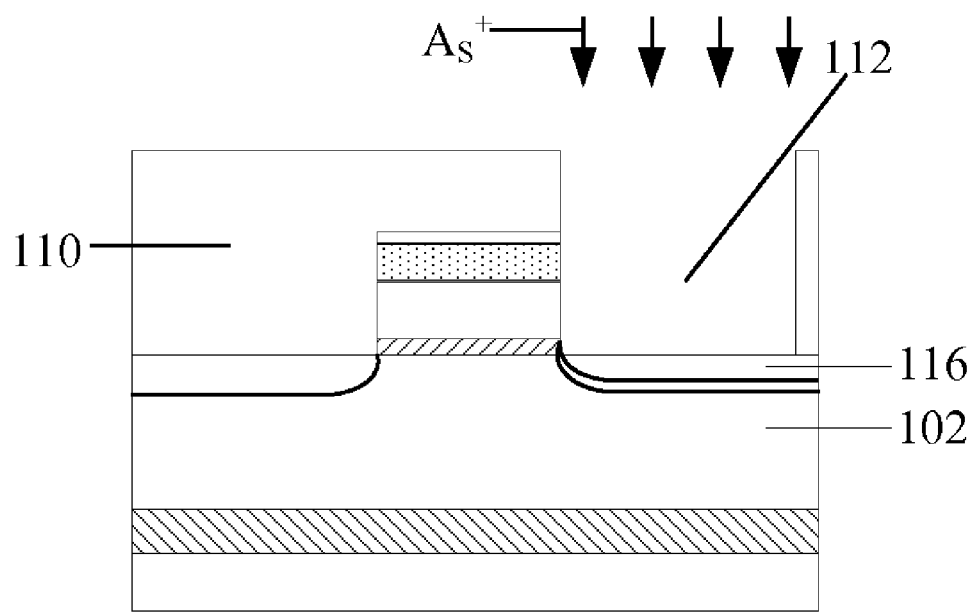
Figure 1E:
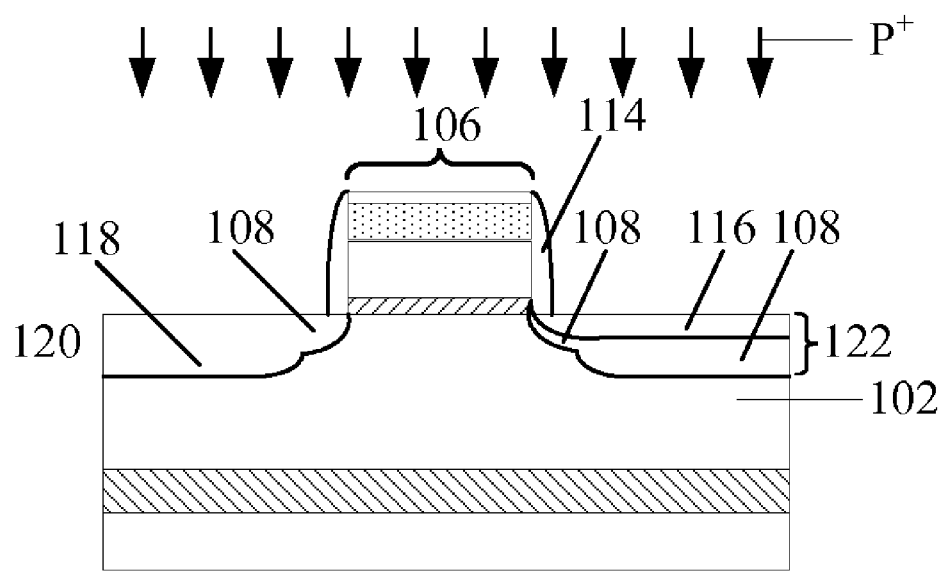
Figure 1F:
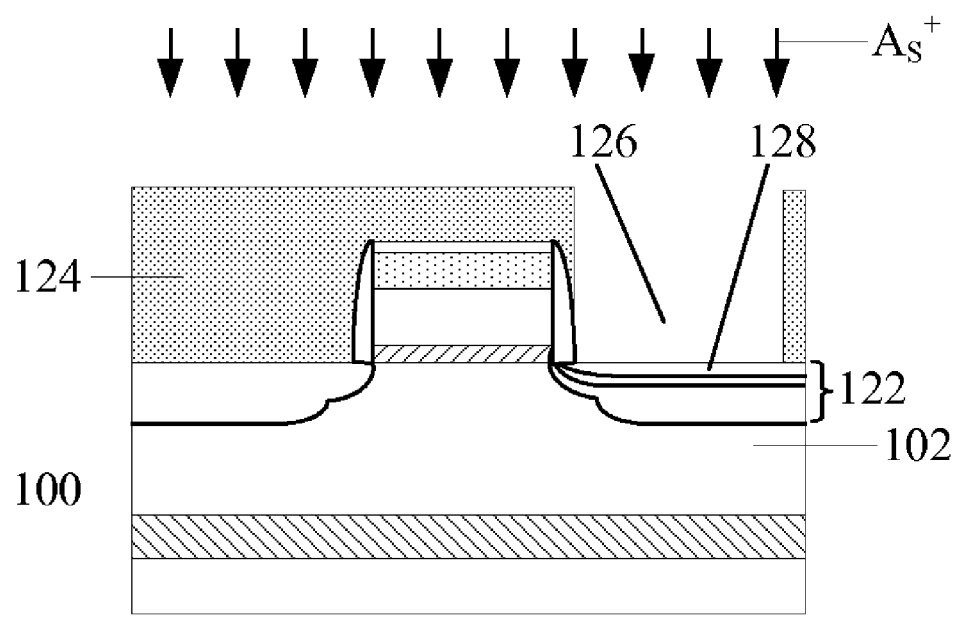
Figure 1G:
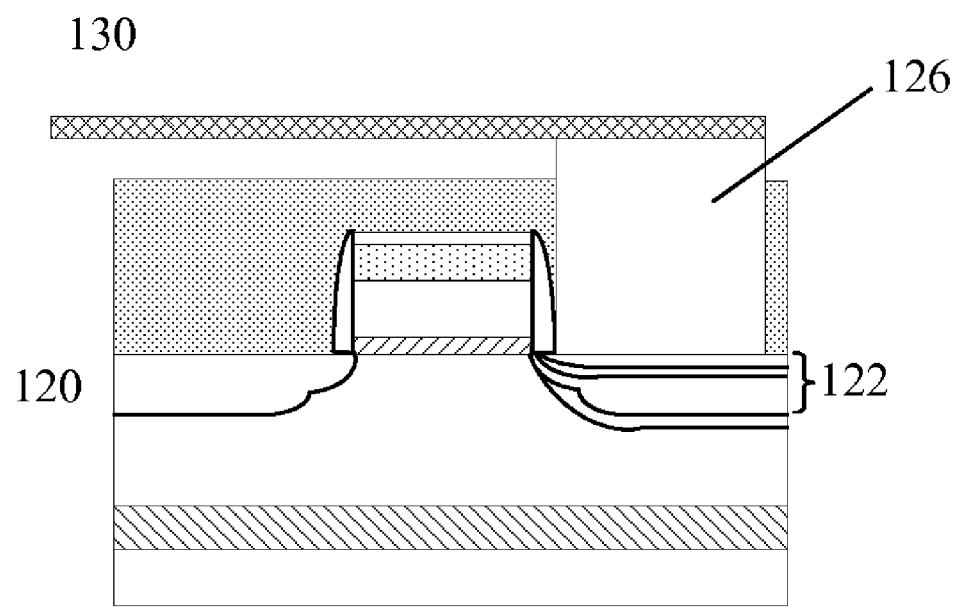
Figure 2:
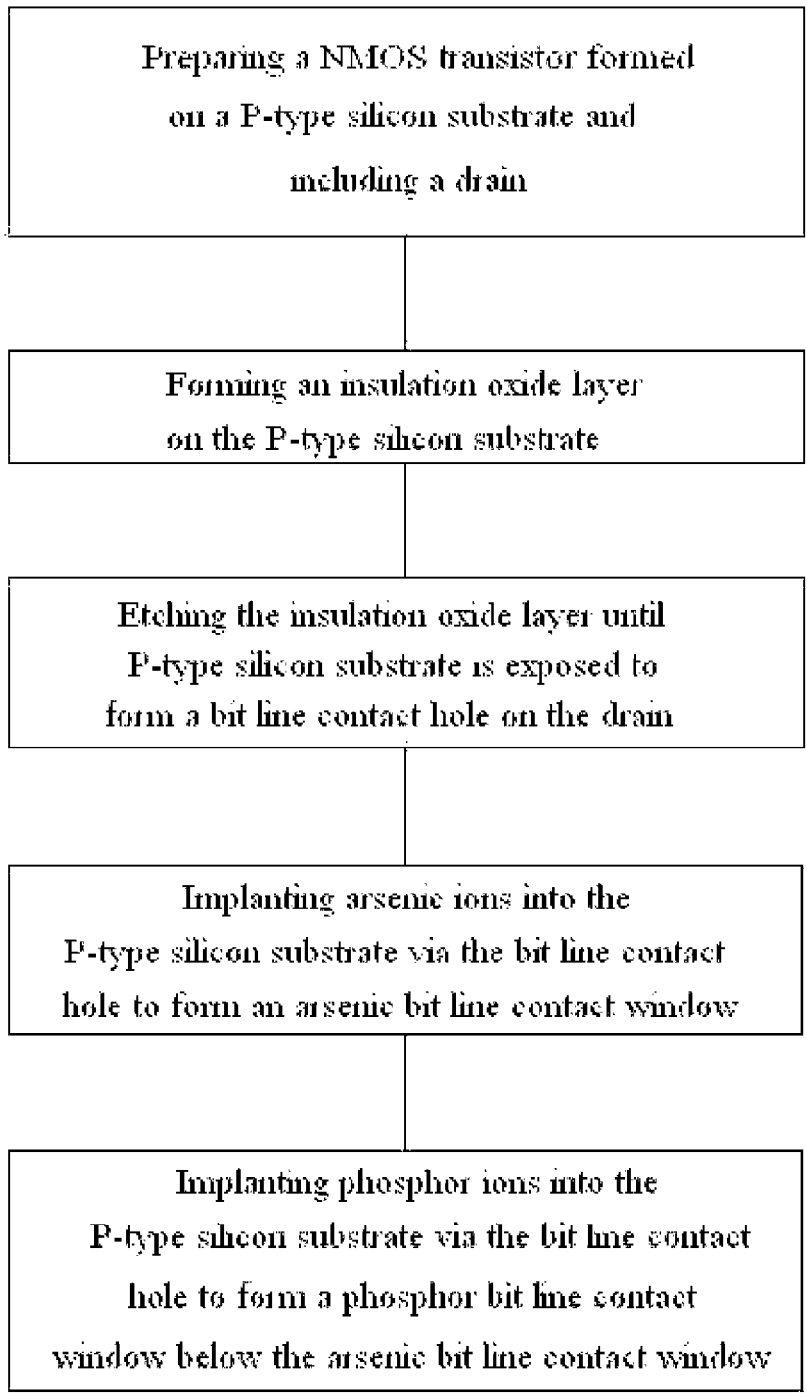
FIG. 2 is a flow chart of a method for fabricating a DRAM according to an embodiment of the present invention.

FIG. 2 is a flow chart of a method for fabricating a DRAM according to the embodiment of the present invention. As illustrated, an NMOS transistor formed on a P-type silicon substrate and including a drain is prepared at step S201. An insulation oxide layer is formed on the P-type silicon substrate at S202. The insulation oxide layer is etched until the P-type silicon substrate is exposed to form a bit line contact hole on the drain at step S203. Arsenic ions are implanted into the P-type silicon substrate via the bit line contact hole to form an arsenic bit line contact window at S204. And phosphorus ions are implanted into the P-type silicon substrate via the bit line contact hole to form a phosphorus bit line contact window below the arsenic bit line contact window at S205.

Figure 3A:
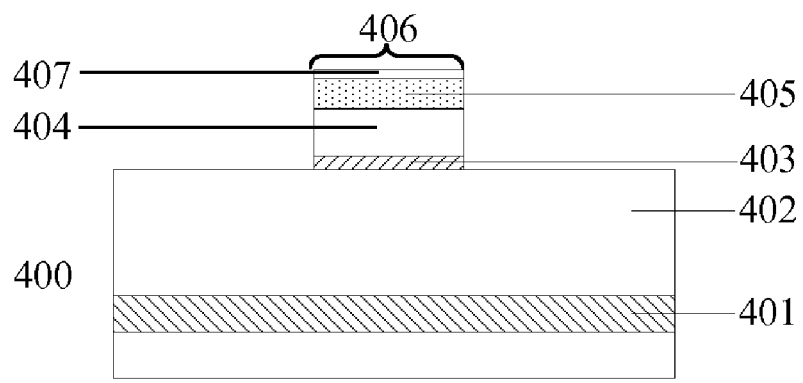
FIG. 3A through FIG. 3H are schematic diagrams of the method for fabricating a DRAM according to the embodiment of the present invention.

FIG. 3A through FIG. 3H are schematic diagrams of the method for fabricating a DRAM according to the embodiment of the present invention. As seen in FIG. 3A, an n$^+$ buried layer 401 is formed by implanting phosphorus ions into a P-type silicon substrate 400 with a dosage of $1\times10^{13}$ ions/cm$^3$ and an energy of 1.25 McV. Born ions are implanted into the P-type silicon substrate 400 for the first time with a dosage of $5.2\times10^{13}$ ions/cm$^3$ and an energy of 260 KeV. Born ions are implanted again with an adjusted dosage of $7.5\times10^{12}$ ions/cm$^3$ and an adjusted energy of 120 KeV so as to form a P-type well 402. A gate oxide layer 403 of silicon oxide with a thickness of 30 to 40 Å is formed on the P-type substrate 400 by a dry oxidation method. A polysilicon layer 404 with a thickness of 70 to 90 nm is formed over the gate oxide layer 403 as a gate by a Chemical Vapor Deposition (CVD) method. A metal silicide layer 405 of tungsten silicide with a thickness of 70 to 80 nm is formed over the polysilicon layer 404 by a CVD method. Then a silicon nitride layer 407 with a thickness of 1500 to 1700 Å is formed over the metal silicide layer 405 by a low-pressure CVD method so as to form a self-aligned bit line contract hole subsequently. Here, a gate structure 406 comprising the gate oxide layer 403, the polysilicon layer 404, the metal silicide layer 405 and the silicon nitride layer 407 is provided.

Figure 3B:
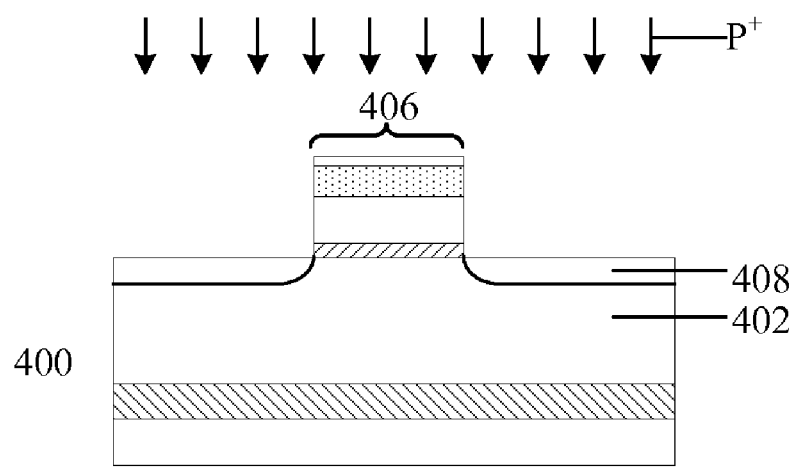

As seen in FIG. 3B, boron ions are implanted into the P-type well 402 with a dosage of $9\times10^{12}$ ions/cm$^3$ and an energy of 10 KeV by an ion implantation method so as to regulate a threshold voltage of the P-type well 402. With the gate structure 406 as a mask, a first lightly-doped drain 408 is formed by implanting phosphorus ions into the P-type well 402 at both sides of the gate structure 406 with a dosage of $1\times10^{13}$ ions/cm$^3$ and an energy of 15 KeV.

Figure 3C:
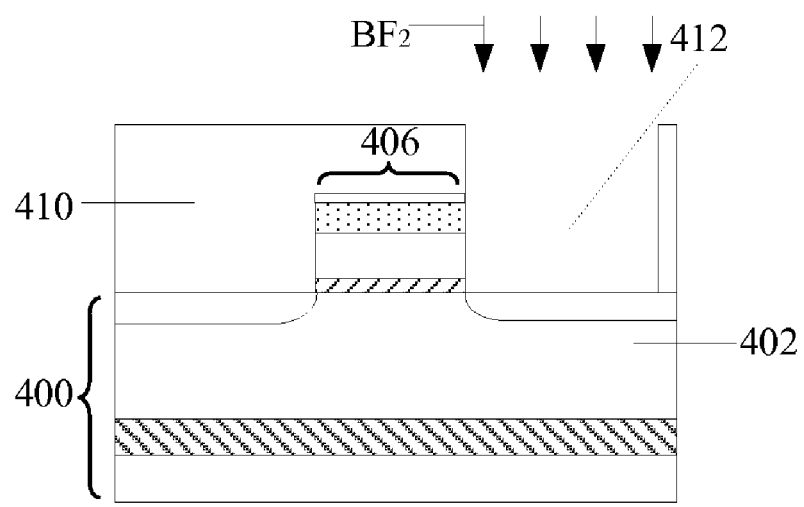

As seen in FIG. 3C, a photoresist layer 410 is formed over the P-type silicon substrate 400 by a spin-coat method, and thus covers the gate structure 406. An opening 412 is formed at one side of the gate structure 406 by exposing and developing the photoresist layer 410, and boron fluoride with a dosage of $5.6\times10^{13}$ ions/cm$^3$ and an energy of 80 KeV is also implanted into the P-type well 402 corresponding to the opening 412 using the photoresist layer 410 as a mask, so as to prevent the source and drain from being broken down subsequently.

Figure 3D:
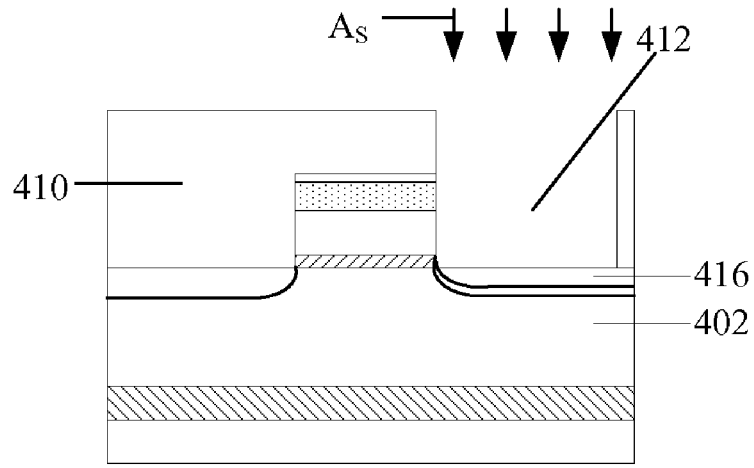

As seen in FIG. 3D, using the photoresist layer 410 as a mask, a first arsenic bit line contact window 416 is formed by implanting arsenic ions into the P-type well 402 corresponding to the opening 412 with a dosage of $3\times10^{14}$ ions/cm$^3$ and an energy of 15 KeV.

Figure 3E:
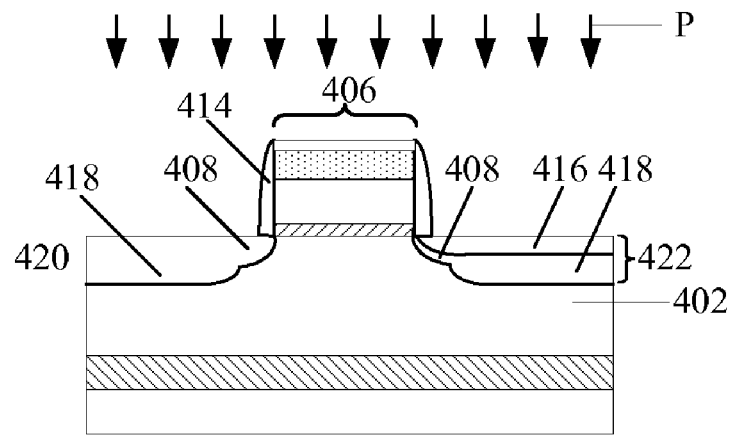

As seen in FIG. 3E, the photoresist layer 410 is removed by concentrated sulfuric acid to form a spacer 414 on both side of the gate structure 406. Then using the gate structure 406 as a mask, a second lightly-doped drain 418 is formed by implanting phosphorus ions into the P-type well 402 with a dosage of $2\times10^{13}$ ions/cm$^3$ and an energy of 20 KeV. An area including the first and second lightly-doped drains 408 and 418 is defined as a source 420, and an area including the first and second lightly-doped drains 408 and 418 and the first bit line contact window 416 is defined as a drain 422.

Figure 3F:
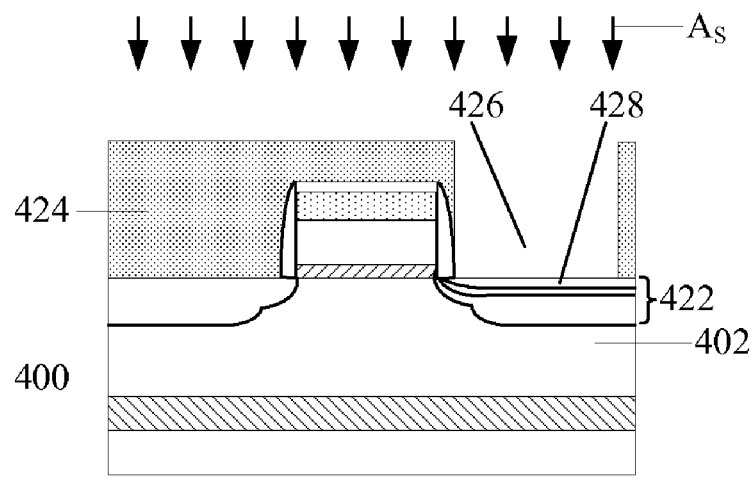

As seen in FIG. 3F, an insulation oxide layer 424 with a thickness of 400 to 600 nm is formed over the P-type silicon substrate 400 by a CVD method, and the insulation oxide layer 424 is etched by a dry etch method at the drain 422 until the P-type silicon substrate 400 is exposed, thus forming a contact hole 426. Then a second arsenic bit line contact window 428 is formed by implanting arsenic ions into the P-type well 402 at the drain 422 with a dosage of $1\times10^{15}$ ions/cm$^3$ and an energy of 7 to 15 KeV.

Figure 3G:
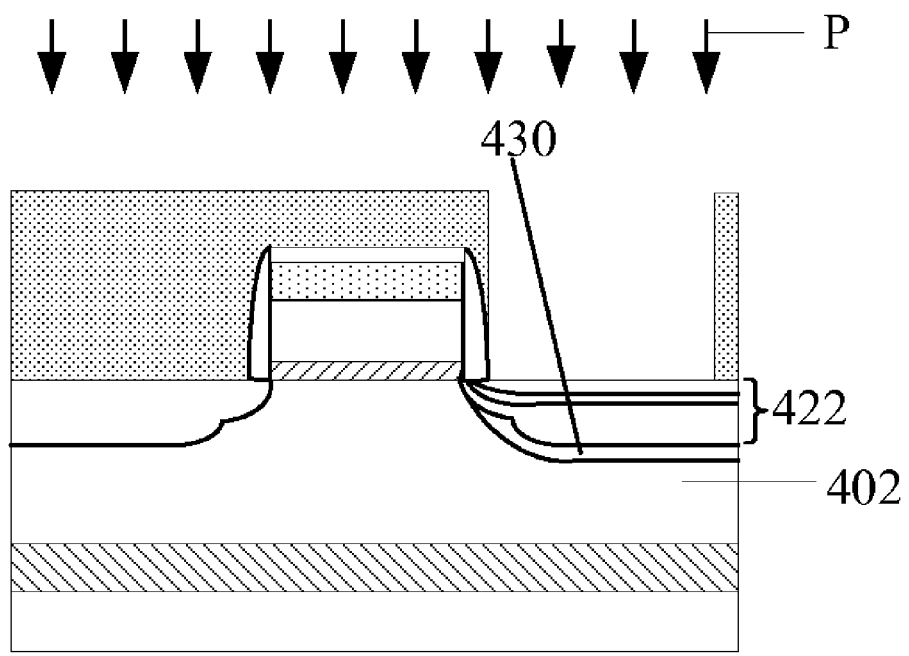

As seen in FIG. 3G, after ionizing phosphine, a phosphorus bit contact window 430 is formed by implanting trivalent phosphorus ions selected via a magnetic field into the P-type well 402 with a dosage of $1\times10^{13}$ to $9\times10^{13}$ ions/cm$^3$ and an energy of 15 to 45 KeV.

Figure 3H:
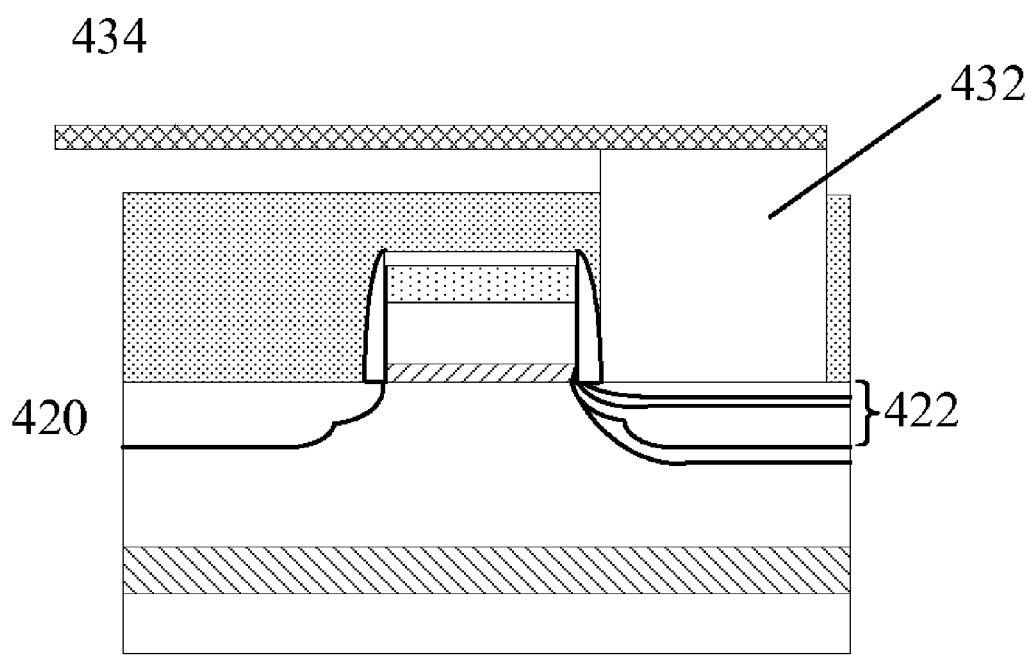

As seen in FIG. 3H, the contact hole 426 is filled with a metal such as tungsten so as to connect the drain 422 and a bit line 432, and a capacitor (not shown) is fabricated at the drain 420, thus forming a DRAM.

In the embodiment, after ionizing phosphine, the phosphorus bit contact window 430 is formed by implanting trivalent phosphorus ions selected via a magnetic field into the P-type well 402 with a dosage of $1\times10^{13}$ to $9\times10^{13}$ ions/cm$^3$ and an energy of 15 to 45 KeV; particularly, the dosage can be, for example, $1\times10^{13}$ ions/cm$^3$, $2\times10^{13}$ ions/cm$^3$, $3\times10^{13}$ ions/cm$^3$, $4\times10^{13}$ ions/cm$^3$, $5\times10^{13}$ ions/cm$^3$, $6\times10^{13}$ ions/cm$^3$, $7\times10^{13}$ ions/cm$^3$, $8\times10^{13}$ ions/cm$^3$ or $9\times10^{13}$ ions/cm$^3$, with $3\times10^{13}$ ions/cm$^3$ being preferable, and the energy can be, for example, 15 KeV, 20 KeV, 25 KeV, 30 KeV, 35 KeV, 40 KeV or 45 KeV, with 35 KeV being preferable.

The second arsenic bit line contact window 428 is formed by implanting arsenic ions into the P-type well 402 at the drain 422 with an energy of 7 to 15 KeV; particularly, the specific energy can be, for example, 7 KeV, 8 KeV, 9 KeV, 10 KeV, 11 KeV, 12 KeV, 13 KeV, 14 KeV or 15 KeV, with 10 KeV being preferable in the embodiment.

In the embodiment, the thickness of the gate oxide layer 403 is 30 to 40 Å; particularly, the thickness can be, for example, 30 Å, 34 Å, 37 Å or 40 Å, with 34 Å being preferable. The thickness of the polysilicon layer 404 is 70 to 90 nm; particularly, the thickness can be, for example, 70 nm, 80 nm or 90 nm. The thickness of the metal silicide layer 405 is 70 to 80 nm; particularly, the thickness can be, for example, 70 nm, 75 nm or 80 nm. The thickness of the silicon nitride layer 407 is 1500 to 1700 Å; particularly, the thickness can be, for example, 1500 Å, 1600 Å or 1700 Å.

The thickness of the insulation oxide layer 424 is 400 to 600 nm; particularly, the thickness can be, for example, 400 nm, 500 nm or 600 nm.

Figure 4:
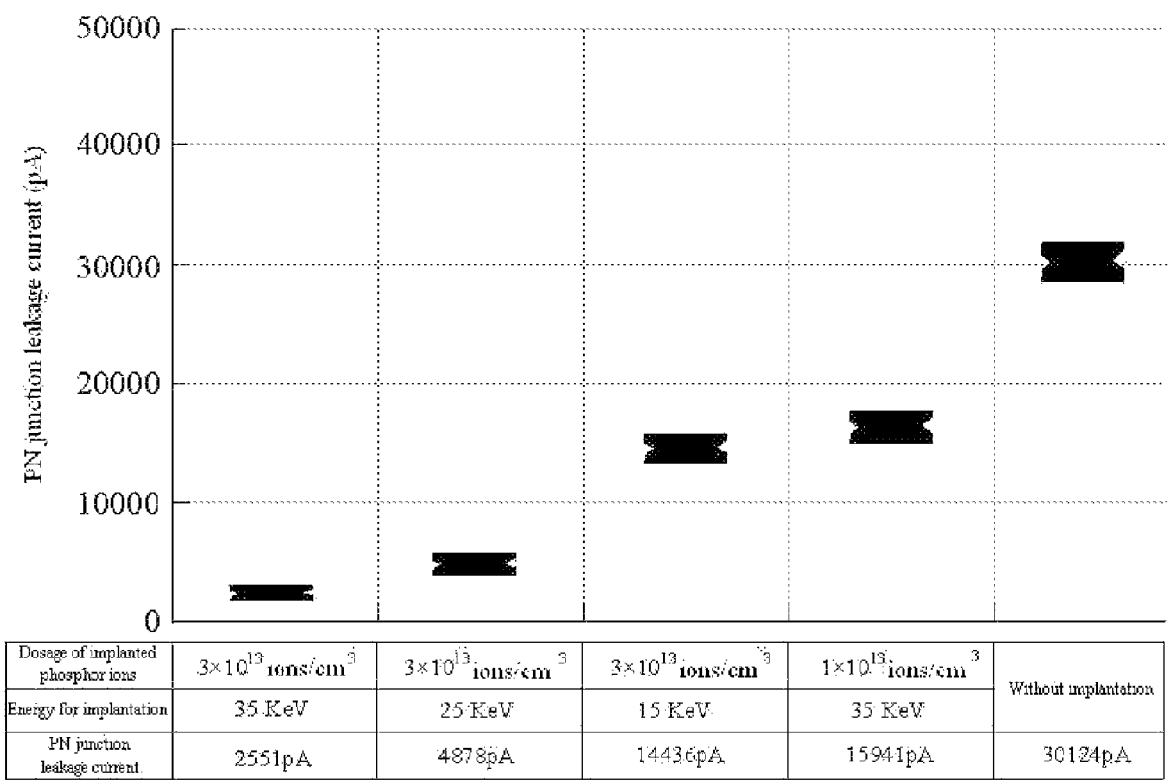
FIG. 4 is a comparative diagram of junction leakage currents generated in fabricating the DRAM according to the embodiment of the present invention.

FIG. 4 is a comparative diagram of junction leakage currents generated in the fabrication of the DRAM according to the embodiment of the present invention. As illustrated, in the DRAM fabrication described in FIG. 3A through FIG. 3H, the phosphorus bit contact window 430 is formed by implanting trivalent phosphorus ions selected via a magnetic field into the P-type well 402 after ionizing phosphine. A PN junction leakage current is minimum, i.e. 2551 pA, in the case of implanting phosphorus ions with a dosage of $3\times10^{13}$ ions/cm$^3$ and an energy of 35 KeV. The PN junction leakage current is 4878 pA in the case of implanting phosphorus ions with a dosage of $3\times10^{13}$ ions/cm$^3$ and an energy of 25 KeV. The PN junction leakage current is 14436 pA in the case of a dosage of $3\times10^{13}$ ions/cm$^3$ and an energy of 15 KeV. The PN junction leakage current is 15941 pA in the case of a dosage of $1\times10^{13}$ ions/cm$^3$ and an energy of 35 KeV. Therefore, it is preferable that implantation of phosphorus ions is performed with a dosage of $3\times10^{13}$ ions/cm$^3$ and an energy of 35 KeV.

However, in the prior art, an interface leakage current could be up to 30124 pA without implanting phosphorus ions into the P-type well 402 to form the bit line contact window 430.

While the preferred embodiments of the present invention have been described as above, it shall be appreciated that the scope of the present invention shall not be limited thereto, and those skilled in the art can obviously make various variations and modifications to the embodiments without departing from the scope of the present invention. Thus, it is intended that all such variations and modifications shall fall within the scope of the present invention as solely defined in the claims thereof.

What is claimed is:

1. A method for decreasing a PN junction leakage current of a dynamic random access memory (DRAM), comprising the steps of:
    preparing an NMOS transistor formed on a P-type silicon substrate and comprising a drain;
    forming an insulation oxide layer on the P-type silicon substrate;
    etching the insulation oxide layer until the P-type silicon substrate is exposed to form a bit line contact hole on the drain;
    implanting arsenic ions into the P-type silicon substrate via the bit line contact hole to form an arsenic bit line contact window;
    implanting phosphorus ions into the P-type silicon substrate via the bit line contact hole to form a phosphorus bit line contact window below the arsenic bit line contact window; and
    selecting trivalent phosphorus ions via a magnetic field and implanting selected trivalent phosphorus ions into the P-type substrate after ionizing phosphine.

2. The method for decreasing a PN junction leakage current of DRAM according to claim 1, wherein arsenic ions are implanted into the P-type silicon substrate by an ion implantation method.

3. The method for decreasing a PN junction leakage current of DRAM according to claim 2, wherein an energy for implanting arsenic ions is 7 to 15 KeV.

4. The method for decreasing a PN junction leakage current of DRAM according to claim 3, wherein a dosage for implanting arsenic ions is $1\times10^{15}$ ions/cm$^3$.

5. The method for decreasing a PN junction leakage current of DRAM according to claim 1, wherein an energy for implanting phosphorus ions is 15 to 45 KeV.

6. The method for decreasing a PN junction leakage current of DRAM according to claim 3, wherein a dosage for implanting phosphorus ions is $1\times10^{13}$ to $9\times10^{13}$ ions/cm$^3$.

7. The method for decreasing a PN junction leakage current of DRAM according to claim 1, wherein the insulation oxide layer with a thickness of 30 to 40 Å is formed on the P-type silicon substrate by an oxidation method.

8. The method for decreasing a PN junction leakage current of DRAM according to claim 1, wherein the insulation oxide layer is etched by a dry etch method until the P-type silicon substrate is exposed so as to form the bit line contact hole on the drain.

* * * * *